United States Patent
Lee

(10) Patent No.: US 10,861,947 B2
(45) Date of Patent: Dec. 8, 2020

(54) METHODS FOR PROCESSING HIGH ELECTRON MOBILITY TRANSISTOR (HEMT)

(71) Applicant: RFHIC Corporation, Anyang (KR)

(72) Inventor: Won Sang Lee, Chapel Hill, NC (US)

(73) Assignee: RFHIC CORPORATION, Anyang (KR)

( * ) Notice: Subject to any disclaimer, the term of this patent is extended or adjusted under 35 U.S.C. 154(b) by 0 days.

(21) Appl. No.: 16/884,005

(22) Filed: May 26, 2020

(65) Prior Publication Data

US 2020/0287004 A1 Sep. 10, 2020

Related U.S. Application Data

(62) Division of application No. 16/207,113, filed on Dec. 1, 2018, now Pat. No. 10,707,311, which is a division
(Continued)

(51) Int. Cl.
*H01L 29/40* (2006.01)
*H01L 29/417* (2006.01)
(Continued)

(52) U.S. Cl.
CPC ...... *H01L 29/404* (2013.01); *H01L 21/76898* (2013.01); *H01L 21/8232* (2013.01); *H01L 23/481* (2013.01); *H01L 24/05* (2013.01); *H01L 27/0605* (2013.01); *H01L 27/085* (2013.01); *H01L 29/0619* (2013.01); *H01L 29/2003* (2013.01); *H01L 29/205* (2013.01); *H01L 29/401* (2013.01); *H01L 29/408* (2013.01); *H01L 29/4175* (2013.01); *H01L 29/66462* (2013.01); *H01L 29/7786* (2013.01); *H01L 29/7787* (2013.01); *H01L 21/8252* (2013.01);
(Continued)

(58) Field of Classification Search
CPC .................................... H01L 29/404
USPC ............................................. 257/76
See application file for complete search history.

(56) References Cited

U.S. PATENT DOCUMENTS 7,504,673 B2 * 3/2009 Sadaka ............... H01L 27/0605
257/194
7,675,090 B2 * 3/2010 Sadaka ............. H01L 29/41766
257/194
(Continued)

*Primary Examiner* — Jami Valentine Miller
(74) *Attorney, Agent, or Firm* — Patent Office of Dr. Chung Park

(57) ABSTRACT

Methods for processing a semiconductor transistor are provided, where the semiconductor transistor includes a substrate, an epitaxial layer, and transistor components that are formed on the epitaxial layer. The method includes: removing a portion of the substrate that is disposed below a portion of the transistor components, to thereby expose a portion of a bottom surface of the epitaxial layer; forming an electrically insulating layer on the exposed portion of the bottom surface of the epitaxial layer; forming a via that extends from a bottom surface of the insulating layer to a bottom surface of one of the transistor components; depositing at least one metal layer on the bottom surface of the insulating layer, on a side wall of the via and on the bottom surface of one of the transistor components; and applying a solder paste to a bottom surface of the at least one metal layer.

12 Claims, 10 Drawing Sheets

Related U.S. Application Data of application No. 15/588,650, filed on May 7, 2017, now Pat. No. 10,217,827.

(60) Provisional application No. 62/334,837, filed on May 11, 2016.

(51) Int. Cl.

| | |
|---|---|
| *H01L 29/778* | (2006.01) |
| *H01L 29/06* | (2006.01) |
| *H01L 23/00* | (2006.01) |
| *H01L 27/085* | (2006.01) |
| *H01L 21/768* | (2006.01) |
| *H01L 23/48* | (2006.01) |
| *H01L 27/06* | (2006.01) |
| *H01L 29/20* | (2006.01) |
| *H01L 29/205* | (2006.01) |
| *H01L 29/66* | (2006.01) |
| *H01L 21/8232* | (2006.01) |
| *H01L 21/8252* | (2006.01) |
| *H01L 21/8234* | (2006.01) |

(52) U.S. Cl.
CPC ...... *H01L 21/823481* (2013.01); *H01L 24/03* (2013.01); *H01L 24/29* (2013.01); *H01L 24/94* (2013.01); *H01L 29/0657* (2013.01); *H01L 29/402* (2013.01); *H01L 2224/0345* (2013.01); *H01L 2224/03462* (2013.01); *H01L 2224/04026* (2013.01); *H01L 2224/0508* (2013.01); *H01L 2224/05027* (2013.01); *H01L 2224/0557* (2013.01); *H01L 2224/05073* (2013.01); *H01L 2224/05084* (2013.01); *H01L 2224/05139* (2013.01); *H01L 2224/05147* (2013.01); *H01L 2224/05572* (2013.01); *H01L 2224/05583* (2013.01); *H01L 2224/05644* (2013.01); *H01L 2224/293* (2013.01); *H01L 2224/29009* (2013.01); *H01L 2224/29022* (2013.01); *H01L 2224/29025* (2013.01); *H01L 2224/29294* (2013.01); *H01L 2224/32245* (2013.01); *H01L 2224/83191* (2013.01); *H01L 2224/94* (2013.01); *H01L 2924/1033* (2013.01); *H01L 2924/10344* (2013.01); *H01L 2924/13064* (2013.01)

(56) References Cited

U.S. PATENT DOCUMENTS

| | | | | |
|---|---|---|---|---|
| 2002/0117681 | A1* | 8/2002 | Weeks | H01L 29/0657 257/106 |
| 2006/0202272 | A1* | 9/2006 | Wu | H01L 29/7787 257/355 |
| 2008/0128752 | A1* | 6/2008 | Wu | H01L 29/7786 257/194 |
| 2014/0367695 | A1* | 12/2014 | Barlow | H01L 29/0688 257/76 |
| 2015/0014740 | A1* | 1/2015 | Briere | H01L 27/0694 257/133 |
| 2015/0129888 | A1* | 5/2015 | Nishimori | H01L 21/28264 257/76 |
| 2015/0255547 | A1* | 9/2015 | Yuan | H01L 27/0629 257/76 |
| 2017/0033187 | A1* | 2/2017 | Rajan | H01L 29/8611 |
| 2017/0345955 | A1* | 11/2017 | Chary | H01L 31/047 |

\* cited by examiner

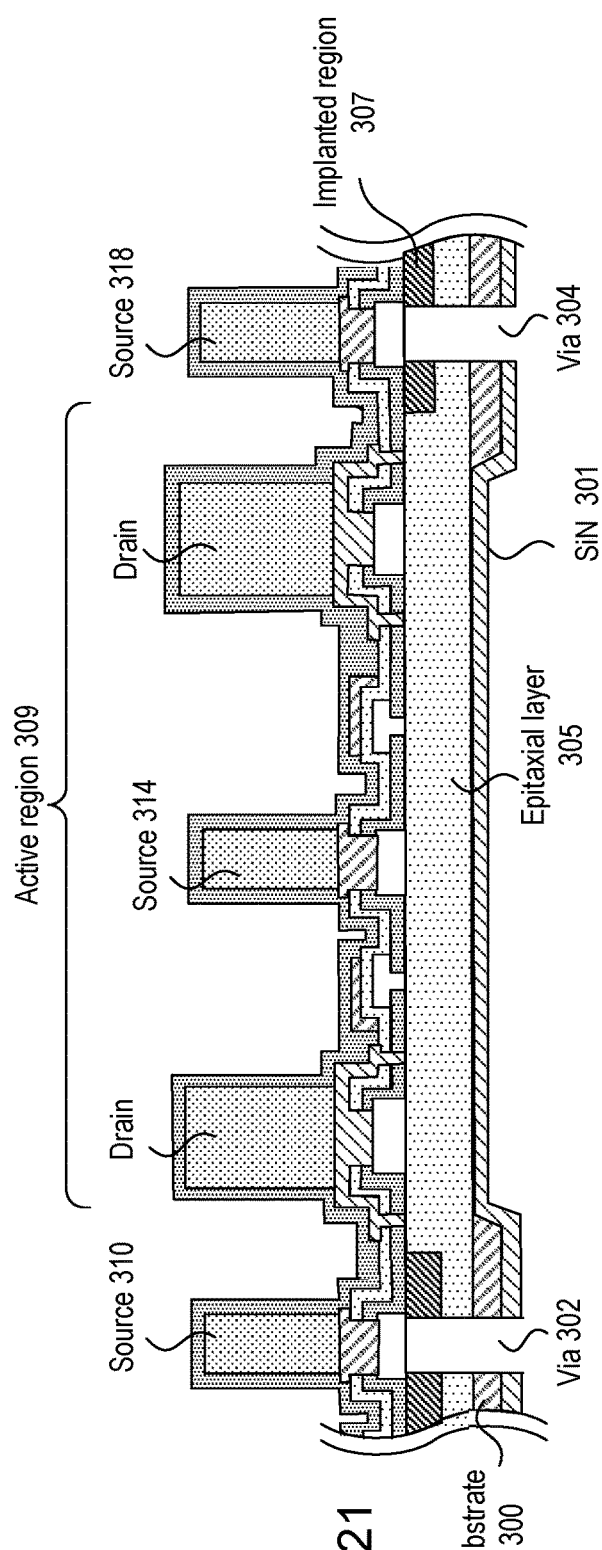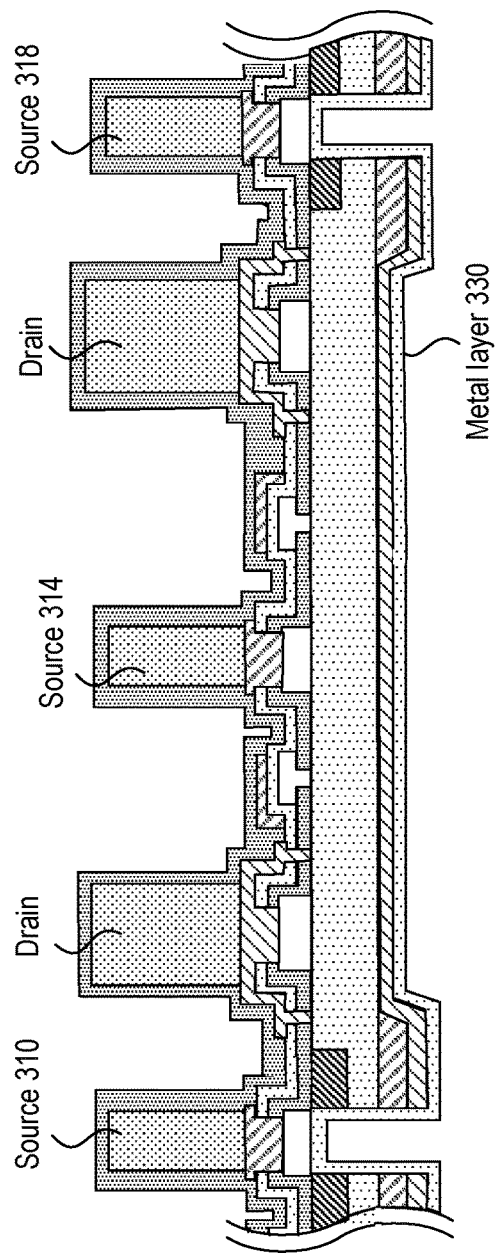

METHODS FOR PROCESSING HIGH ELECTRON MOBILITY TRANSISTOR (HEMT)

CROSS REFERENCE TO PRIOR APPLICATIONS

This application is a divisional application of a U.S. patent application Ser. No. 16/207,113, filed on Dec. 2, 2018, which is a divisional application of a U.S. patent application Ser. No. 15/588,650, filed on May 7, 2017, and now issued as U.S. patent Ser. No. 10/217,827 on Feb. 26, 2019, which claims priority to U.S. Provisional Patent Application No. 62/334,837, filed on May 11, 2016, which are hereby incorporated by reference in their entirety.

BACKGROUND

A. Technical Field

The present invention relates to semiconductor devices, and more particularly, to methods for processing high electron mobility transistors.

B. Background of the Invention

The high electron mobility transistor (HEMT), also known as heterostructure FET (HFET) or modulation-doped FET (MODFET), is a type of field effect transistor (FET) in which a hetero-junction between a channel layer and a barrier layer whose electron affinity is smaller than that of the channel layer is formed. HEMT transistors are able to operate at higher frequencies than ordinary transistors, up to millimeter wave frequencies, and are typically used in high-frequency and high-power products, such as power amplifier between mobile phone stations and phased array laser in military applications.

In general, HEMTs for operation at the radio frequency (RF) range require higher breakdown voltage than the ordinary transistors, where the breakdown voltage is the maximum voltage that the gate of a transistor can handle. In existing HEMTs, a source-connected gate field plate has been used to increase the breakdown voltage. However, with the advent of modern mobile communication technology, a demand for HEMTs with higher breakdown voltages has been continuously increased. Also, in order to get good linearity, a gate-drain capacitance (Cgd) value needs to remain flat in the dynamic driving range.

Also, HEMTs designed to operate at high power ranges may generate high heat energy. Thus, they need to be designed for low output resistances so that they can deliver large currents to the load, and good junction insulation to withstand high voltages. As most heat energy is generated at the heterojunction, the area of this junction can be made as large as possible so that the heat energy can be dissipated very quickly to thereby prevent overheat. However, in many high power applications, the form factor of HEMTs may impose limitations on the size of the device area, resulting in the limitation to the maximum power that the HEMTs can handle.

As such, there is a need for HEMTs that have high breakdown voltages, flat Cgd value in the dynamic driving range, and enhanced heat dissipation mechanisms, to thereby increase the maximum voltage, linearity, and power ratings at various applications, especially at radio frequency ranges.

SUMMARY OF THE DISCLOSURE

In embodiments, a drain field plate is formed over the drain of a HEMT. The drain field plate includes a metal pad that has a larger projection area than the drain pad. The drain field plate reduces the strength of the electric field that is generated by the gate side drain pad, resulting in the increase of the breakdown voltage of the HEMT.

In embodiments, a drain field plate is formed by depositing a SiN passivation layer, patterning the SiN passivation layer, and depositing a metal layer over the patterned SiN layer. The drain field plate and the underlying semiconductor layer forms Metal-semiconductor (M-S) Schottky junction that generates depletion layer in the semiconductor, where the depletion layer increases the breakdown voltage of the HEMT. And, by varying the shape of the drain field plate, the gate-drain capacitance (Cgd) and the drain-source capacitance (Cds) can be controlled, enhancing the RF characteristics of the HEMT.

In embodiments, a HEMT is designed to reduce the bulk leakage current and junction temperature (Tj). Upon completion of processing the front side, (i.e., forming transistor components on the front side of the substrate), the backside of substrate may be processed to enhance the heat dissipation. In embodiments, the backside processing includes several steps. First, the portion of the substrate under the active area is removed (etched). Then, a SiN layer may be deposited over the entire back-side surface, where the thickness of the SiN layer is preferably about 35 nm. Next, a via hole is made through the AlGaN/GaN epitaxial layer under the source. A first metal layer made of Ti/Au may be deposited on the back side surface by a suitable process, such as sputtering, and a second metal layer having a composite structure, such as Cu/Au, Cu/Au/Cu/Au, or Cu/Ag/Au, may be formed over the first metal layer so that the backside of the substrate and the source on the front side are electrically connected through the via.

In embodiments, the backside processing may remove the substrate under the active area before the metal layers are deposited under the active area. Since the typical substrate materials, such as Si or sapphire, have lower heat conductivity than the metal layers, the backside processing may increase the heat conductivity of the HEMT, reducing the Tj of the transistor components. In embodiments, the back side processing may remove the substrate under the active area before the SiN layer is deposited. Since the typical substrate materials have lower electrical insulation than SiN, the backside processing may increase the electrical insulation, reducing the bulk leakage current of the transistor components.

In embodiments, each HEMT may be diced from the wafer (i.e., singulation process is performed) and attached to a package without the conventional pre-forming of eutectic die attach, which reduces at least one fabrication step and thus reducing the manufacturing cost. In embodiments, surface-mount-device (SMD) reflow method may be used to attach the die to the package.

Typically, the conventional die bonding processes has to encounter the air void problem, where the air void reduces the heat conductivity and negatively affects the reliability of the transistor. In embodiments, the solder paste is deposited over the backside to fill the via hole and the recessed area of the substrate, obviating the formation of air void during the die bonding process.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. 21 shows an exemplary process for processing backside of a HEMT wafer according to embodiments of the present invention.

FIG. 22 shows an exemplary process for depositing a metal layer over the backside surface of the wafer according to embodiments of the present invention.

DETAILED DESCRIPTION OF THE PREFERRED EMBODIMENTS

Figure 1:
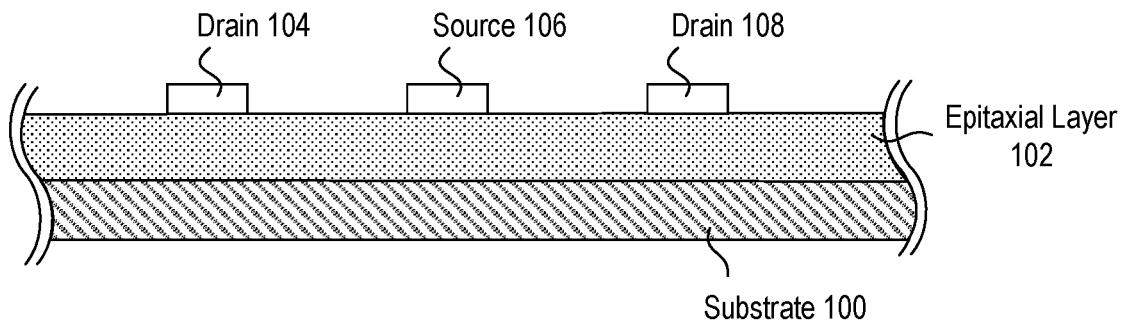
FIGS. 1-5 show an exemplary process for forming semiconductor components on the front side of a substrate according to embodiments of the present invention.

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system, a device, or a method on a tangible computer-readable medium.

One skilled in the art shall recognize: (1) that certain steps may optionally be performed; (2) that steps may not be limited to the specific order set forth herein; and (3) that certain steps may be performed in different orders, including being done contemporaneously.

Elements/components shown in diagrams are illustrative of exemplary embodiments of the disclosure and are meant to avoid obscuring the disclosure. Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," or "in embodiments" in various places in the specification are not necessarily all referring to the same embodiment or embodiments. The terms "include," "including," "comprise," and "comprising" shall be understood to be open terms and any lists that follow are examples and not meant to be limited to the listed items. Any headings used herein are for organizational purposes only and shall not be used to limit the scope of the description or the claims. Furthermore, the use of certain terms in various places in the specification is for illustration and should not be construed as limiting.

The embodiments of the present disclosure include a drain field plate to increate the breakdown voltage of a HEMT. Also, the drain field plate may be used to increase or decrease the Cgd and/or Cds of the HEMT, maintain flat Cgd value, enhancing the RF characteristics of the HEMT.

The embodiments of the present disclosure include a process to remove a portion of the substrate under the active area, to thereby increase the heat conductivity and reduce the junction temperature of the components of the HEMT.

The embodiments of the present disclosure include a process to remove a portion of the substrate under the active area and deposit a SiN layer. Since the SiN layer has the better electrical insulation property than the substrate material, this process may decrease the bulk leakage current of the components of the HEMT.

The embodiments of the present disclosure include a process to remove a portion of the substrate under the active area and deposit a metal layer. Since a metal layer has the better heat conductivity than the substrate material, this process may increase the heat conductivity and decrease the junction temperature of the component of the HEMT.

The embodiments of the present disclosure include processes to remove a portion of the substrate under the active area and form a via hole, where a metal layer is deposited in the via hole. These processes may decrease the source inductance of the HEMT.

The embodiments of the present disclosure include processes to remove a portion of the substrate under the active area, to deposit a metal layer, and to apply solder paste to the back surface of the wafer, obviating formation of air void to thereby enhance the heat conduction characteristics of the components of the HEMT and reduce the junction temperature of the components of the HEMT.

The embodiments of the present disclosure include processes to remove a portion of the substrate under the active area, to deposit a metal layer, and to apply solder paste to the back surface of the wafer. These processes can eliminate the conventional pre-form process (such as eutectic die attaching process) for attaching a HEMT die to a package, which may reduce the manufacturing cost.

The embodiments of the present disclosure include processes to remove a portion of the substrate under the active area, to deposit a metal layer, and to apply solder paste to the back surface of the wafer. Thus, either eutectic dies attaching process or SMD reflow process can be used to attach the HEMT die to a package.

FIGS. 1-5 show an exemplary process for forming HEMT components on the front (or top) side of a substrate according to embodiments of the present invention. As depicted in FIG. 1, an epitaxial layer 102 is formed on the front (top) side of the substrate 100. The substrate 100 may be preferably formed of Si or sapphire, even though other suitable material may be used for the substrate. The epitaxial layer 102 may be formed of GaN so that AlGaN/GaN heterojunction layer is formed on the substrate. It is noted that the epitaxial layer 102 may be formed of other suitable type of material. Hereinafter, a GaN HEMT is used as an exemplary HEMT, even though other types of HEMT may be fabricated by the processes described in the present document.

Drains (or, equivalently, drain pads or drain electrodes or ohmic metallization for drains) 104 and 108 and a source (or, equivalently, source pads or source electrodes or ohmic metallization for sources) 106 may formed over the epitaxial layer 102, where the drains and source may be formed of suitable metal(s). In embodiment, each of the drains and source may have a composite metal layer structure including Ti/Al/Ni/Au. The ohmic contact of the drains and source may be generated by alloying the drains and source to thereby reduce the resistance at the interface between the drain/source and the epitaxial layer 102.

Figure 2:
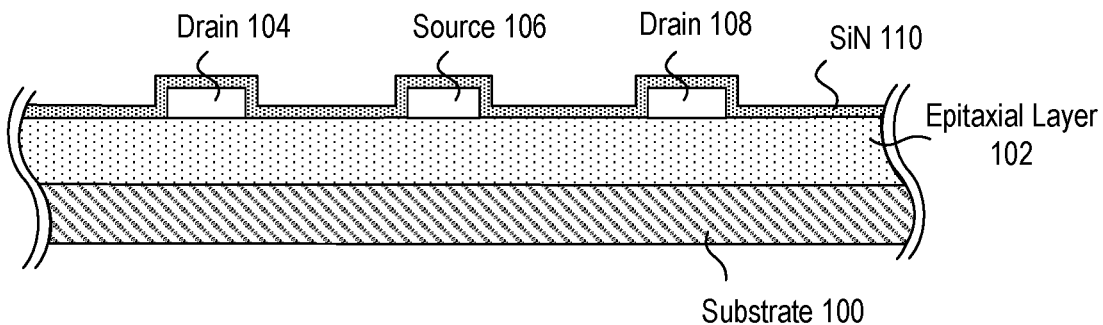

As shown in FIG. 2, an electrically insulating layer 110 may be formed over the front surface of the substrate 100. In embodiments, the insulation layer 110 may be made of SiN, or any other suitable material may be used for electrical insulation. The insulation layer 110 may cover the damages on the top surfaces of the epitaxial layer 102, drains 104 and 108 and source 106 that may be formed during the fabrication of these elements. As described later, SiN layer may be patterned to form gates.

Figure 3:
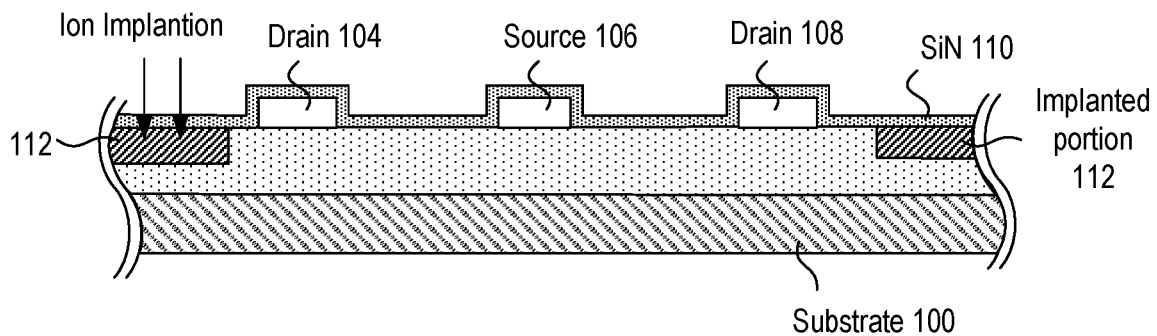

FIG. 3 shows the ion implantation process to generate ion implanted portions (or, shortly, implantation portions) 112, where the implanted portions 112 may isolate the drains 104 and 108 and source 106 as an independent operation unit of a HEMT. In embodiments, a patterned photoresist layer (not shown in FIG. 3) may be coated by a suitable photolithography process over the top surface of the HEMT and used as a photoresist (PR) mask layer to selectively allow the ions, such as nitrogen or oxygen ions, to pass through the insulation layer 110 and be implanted in the epitaxial layer 102 during the implantation process. Then, the photoresist layer is removed subsequently.

Figure 4:
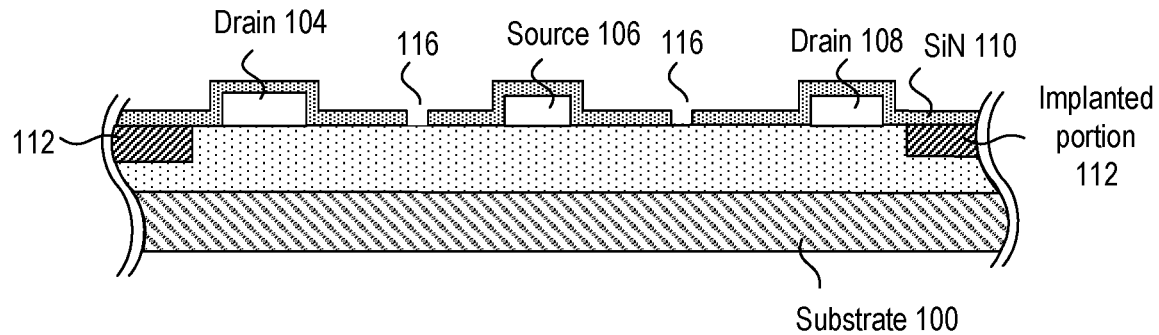

As depicted in FIG. 4, one or more portions of the insulation layer 110 are etched by a suitable etching process. In embodiments, a patterned mask layer (not shown in FIG. 4) may be formed by a photolithography process over the insulation layer 110 and used to remove portions of the insulation layer to thereby form dips 116 and expose the top surface of the epitaxial layer.

Figure 5:
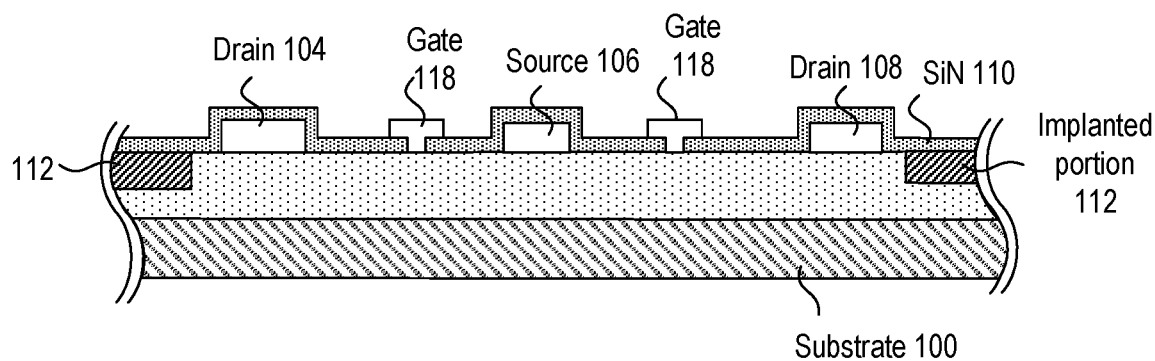

FIG. 5 shows T-gates 118 formed in the dips 116 and have wings that extend over the insulation layer 110. In embodiments, a T-gate photolithography process (not describe in FIG. 5) may be performed and then, subsequently, gate metallization is performed using suitable metals, such as Ni/Au or Ni/Pt/Au.

Figure 6:
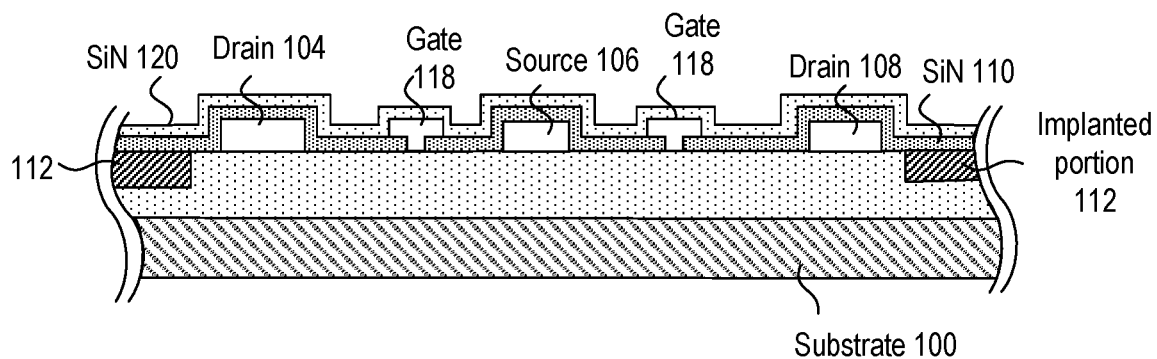
FIG. 6 shows an exemplary process for depositing a passivation layer according to embodiments of the present invention.

As depicted in FIG. 6, a passivation layer 120 may be deposited over the front surface of the HEMT. In embodiments, the passivation layer 120 may be formed of SiN, even though other suitable electrically insulating material may be used for the passivation layer 120. The passivation layer 120 may increase the breakdown voltage between the T-gate 118 and drain/source to thereby enhance reliability of the HEMT. The wings of the T-gate 118 and the insulation layer 110 may generate a capacitance that decreases the electric field of the gate edge area on the drain side to thereby increase the breakdown voltage of the gate 118.

Figure 7:
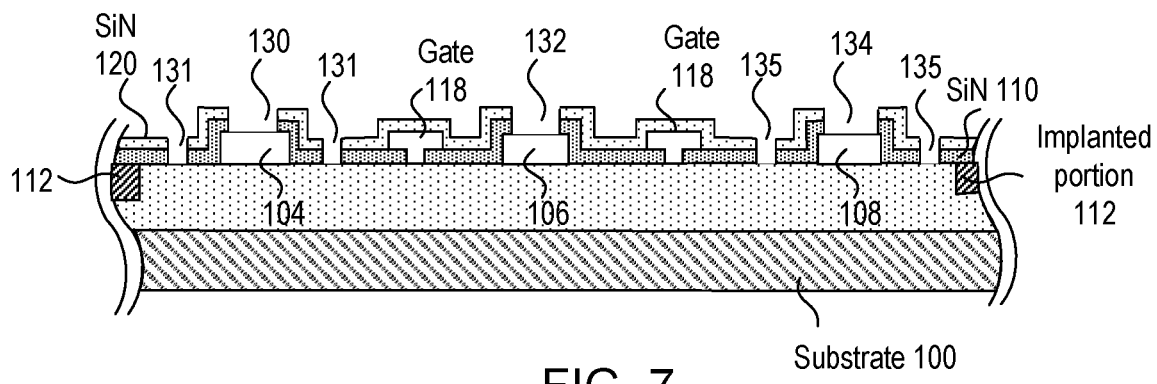
FIG. 7 shows an exemplary process for forming contact opens according to embodiments of the present invention.

FIG. 7 shows an exemplary process for making contact opens according to embodiments of the present invention. As depicted, portions of the insulation layer 110 and the passivation layer 120 are removed to form the contact opens (or dips) 130, 132 and 134 as well as SiN contact opens (or dips) 131 and 135. As discussed below, the SiN contact opens 131 and 135 may be filled with metal(s) to form drain field metals (or, equivalently drain field plates). In embodiments, an etching process based on a photolithography technique may be used to remove the portions of the insulation layer 110 and the passivation layer 120 to thereby expose portions of the top surface of the epitaxial layer 102.

Figure 8:
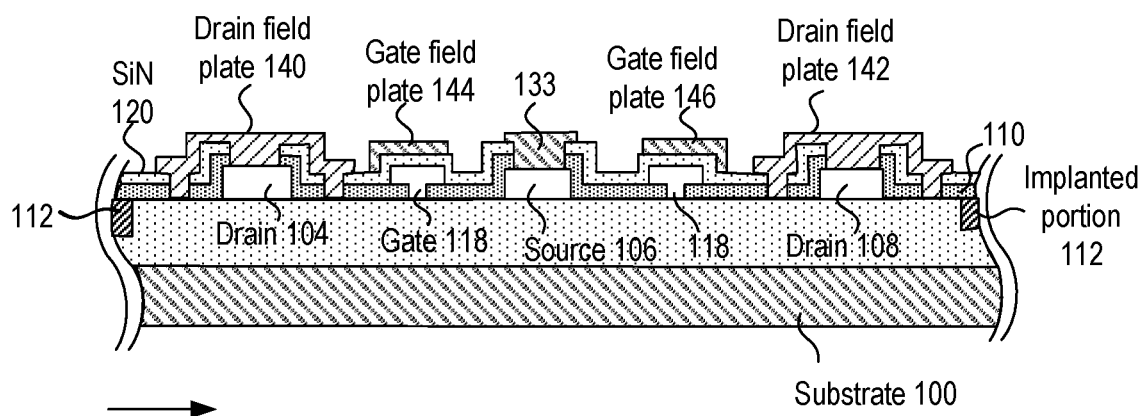
FIG. 8 shows an exemplary process for forming a gate field plate and a drain field plate according to embodiments of the present invention.
Figure 9:
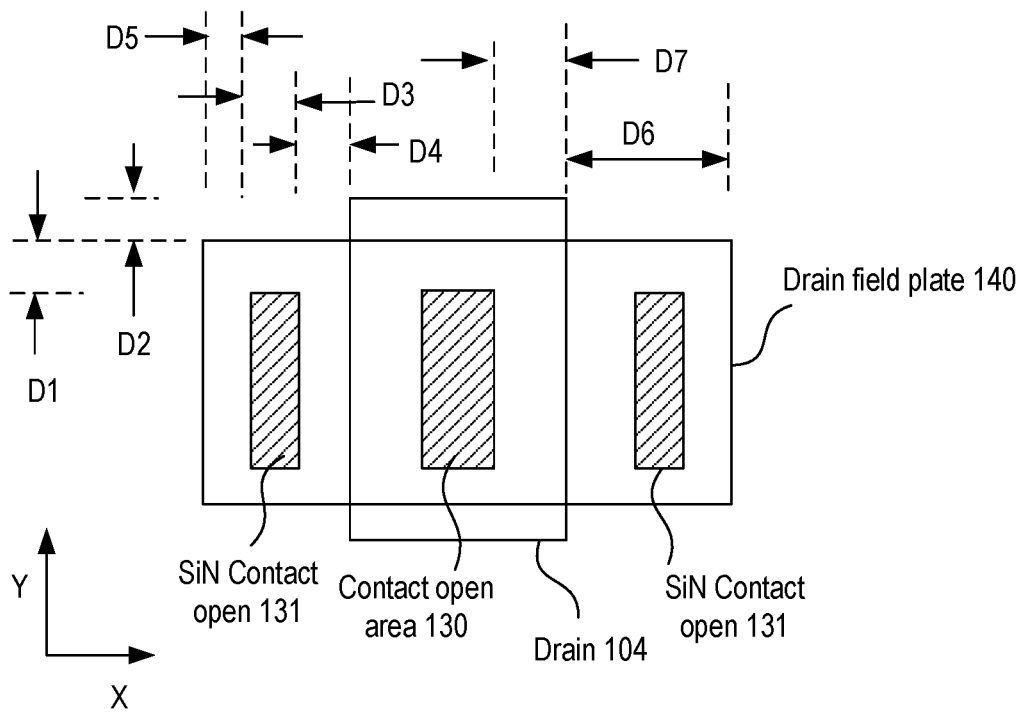
FIG. 9 shows a top view of the drain field plate according to embodiments of the present invention.

FIG. 8 shows an exemplary process for forming a source-connected gate field metal (or, equivalently, source-connected gate field plate) 144 and a drain field plate 140 according to embodiments of the present invention. FIG. 9 shows a top view of the drain field plate 140 according to embodiments of the present invention. The source-connected gate field plate (or, shortly gate field plate) 144, which is formed on the passivation layer 120 over the T-gate 118 and extends toward the drain 104, generates a capacitor with the underlying layers 110 and 120, where this capacitor decreases the electric field of the gate edge area on the drain side to thereby increase the breakdown voltage between the gate 118 and the drain 104. In embodiments, the source-connected gate field plate 144 may be formed of suitable metal(s).

In embodiments, the drain field plate 140 may be formed over the drain 104 and extend beyond edges of the drain 104. The drain field plate 140 has the similar effect as the source-connected gate field plate 144 in that the capacitance generated by the drain field plate 140 may increase the breakdown voltage. More specifically, the drain field plate 140, the layers 110, 120 and the epitaxial layer 102 form a metal-semiconductor (M-S) structure. This M-S Schottky structure generates a capacitance, which in turn generates a depletion region in the epitaxial layer 102 to thereby increase the breakdown voltage.

In general, the fringe capacitance (Cgd) between the gate 118 and the drain 104 have negative effect on the drain-source quiescent current when RF signal is applied to the gate 118, i.e., the quiescent current has fluctuating transient periods. In embodiments, the capacitance generated by M-S Schottky structure of the drain field plate 140 can control the fringe capacitance (Cgd) so that the flatness of Cgd may be maintained.

As depicted in FIG. 9, in embodiments, the drain field plate 140 refers to metallic regions that cover the projection area of the drain 104 and further extend outside the projection area of the drain 104 in the x-direction. (Hereinafter, the term projection area refers to a two-dimensional area obtained by projecting the shape of a three dimensional object onto the x-y plane, where the x-y plane is parallel to the top surface of the epitaxial layer 102.) The drain field plate 140 also refers to metallic regions that cover the projection areas of the SiN contact opens 131 and further extend outside the projection area of the SiN contact opens 131 in both x- and y-directions. In contrast, in conventional systems, the drain contact open 130 is filled with metallic material and the projection area of the drain contact open 130 does not extend outside the projection area of the drain 104.

In embodiments, the length D1, which is the distance between an edge of SiN contact open 131 and an edge of the drain field plate 140 in the y-direction, is about 1 µm. The length D2, which is the distance between an edge of the drain field plate 140 and an edge of the drain 104 in the y-direction, is about 1 µm. The width D3, which is the dimension of the SiN contact open 131 in the x-direction, is about 1 µm. The width D4, which is the distance between an edge of the SiN contact open 131 and an edge of the drain 104 in the x-direction, is about 1 µm. The width D5, which is the distance between an edge of the SiN contact open 131 and an edge of the drain field plate 140 in the x-direction, is about 1 µm. The width D6, which is the distance between an edge of the SiN contact open 131 and an edge of the drain field plate 140 in the x-direction, is about 3 µm. The width D7, which is the distance between an edge of the contact open area 130 and an edge of the drain 104 in the x-direction, is about 5 µm. It is noted that the values of the length D1-D7 are exemplary and other suitable values may be used.

In embodiments, the ratio between the lengths D1-D7 may be maintained even when the dimension of the drain 104 changes. For instance, the ratio between D6 and D7 may be maintained to one, when the dimension of the drain 104 is changed.

The drain field plate 140 may be formed of multiple metal layer structure, such as Ti/Au or Ti/Au/Ti/Au. In embodiments, the source-connected gate field plate 144 and the drain field plate 140 may be formed during the same process, i.e., a patterned mask layer (not shown in FIGS. 8 and 9) may be deposited by a suitable photolithography process so that the source-connected gate field plate 144 and the drain field plate 140 are deposited while the contact open areas 130, 132 and 134 may be also filled with the same metallic material during the same process.

Figure 10:
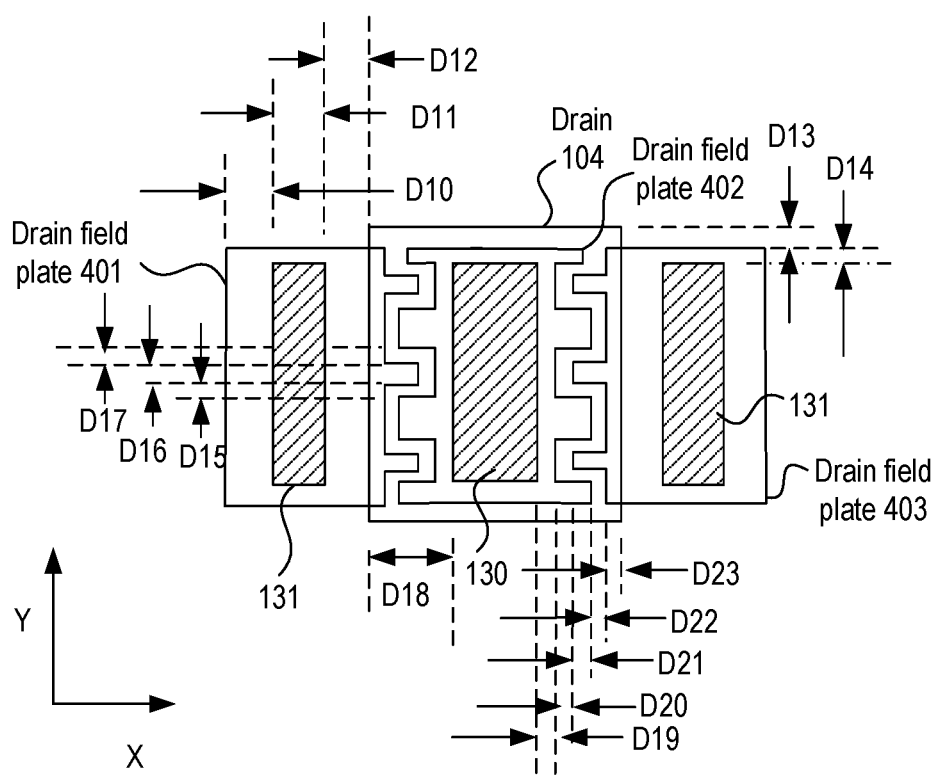
FIG. 10 shows a top view of the drain field plate according to embodiments of the present invention.

FIG. 10 shows a top view of a drain field plate according to another embodiment of the present invention. As depicted, the drain field plate 150 may include three plates 401, 402, and 403, where the plates 401 and 403 are electrically separated from the plate 402 and the plate 402 is electrically connected to the drain 104. The plate 402 includes the metal layer filling the contact open area 130, while the plates 401 and 403 include the metal layers filling the two SiN contact open 131, respectively.

In embodiments, the width D10, D11, and D12, which are similar to the width D5, D3, and D4 in FIG. 9, are about 1 µm, each. Likewise, the lengths, D13 and D14, which are similar to D2 and D1, respectively, are about 1 µm, each.

As depicted in FIG. 10, the sides of the drain field plates 401, 402 and 403 may be interdigitated. For instance, the lengths, D15-D17 and D19-D23, which are associated with the protruding/recessed portions of the interdigitated portion, may be about 1 µm, each. The length D18, which is the distance between an edge of the drain 104 and an edge of the contact open area 130 in the x-direction, may be about 5 µm.

In embodiments, the drain field plates 140, 401, 402 and 403 may have other suitable shapes so that the M-S Schottky structure can have intended capacitance to control Cgd and/or Cgs (the fringe capacitance between the gate and source). In embodiments, the shape of the drain field plate and the distance between the drain field plates and the edge of the drain 104 may be adjusted to achieve the intended capacitance. In embodiments, the interdigital capacitor is open for DC signal, but becomes electrically shorted for RF signals, which causes the interdigital capacitor to operate selectively in response to RF signals. It is noted that the top view of the drain field plate 142 and SiN contact opens 135 have the same configuration as FIGS. 9 and 10, i.e., the drain field plate 142 may have the same shape as the drain filed plate 140 or the drain filed plate 142 may have three metal plates that are similar to the metal plates 401, 402, and 403.

Figure 11:
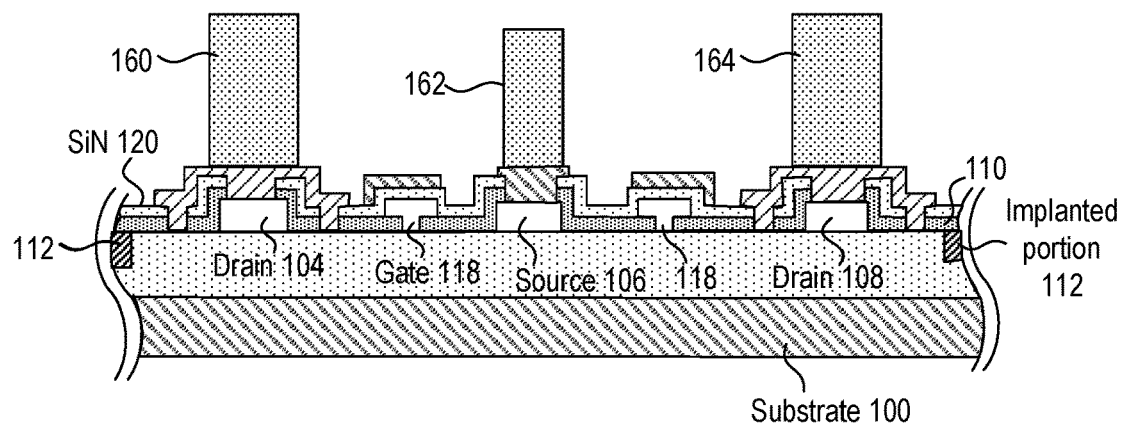
FIG. 11 shows an exemplary process for plating a metal layer on the transistor components according to embodiments of the present invention.

FIG. 11 shows an exemplary process for plating a metal layer on the transistor components according to embodiments of the present invention. As depicted, the metallic elements 160, 162, and 164 may be deposited over the drains and source by a plating process, such as Au plating process, so that the components may be electrically connected by the air bridge or bonding pad process.

Figure 12:
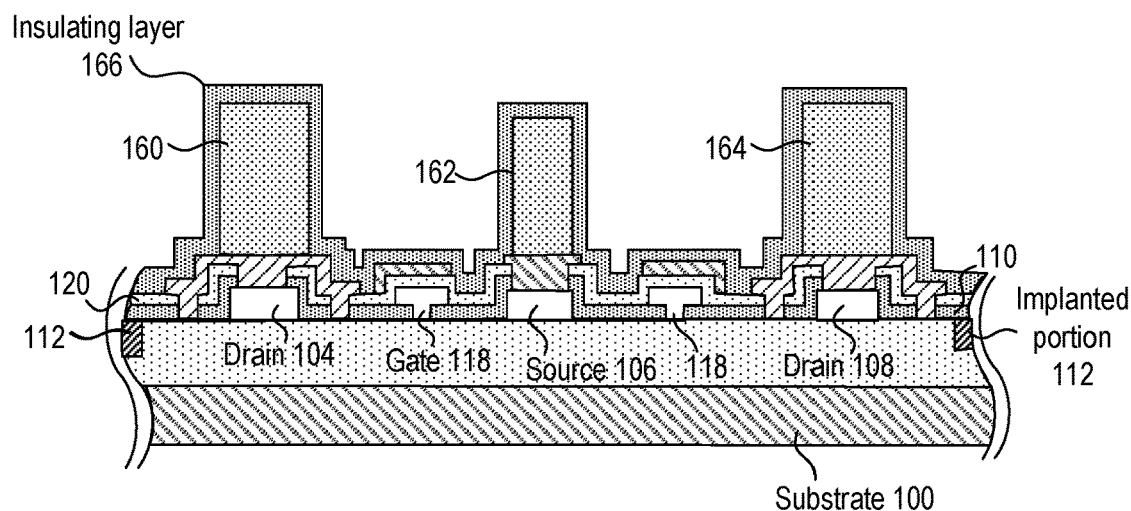
FIGS. 12 and 13 show exemplary processes to deposit an electrically insulating layer and to etch portions of the insulating layer according to embodiments of the present invention.
Figure 13:
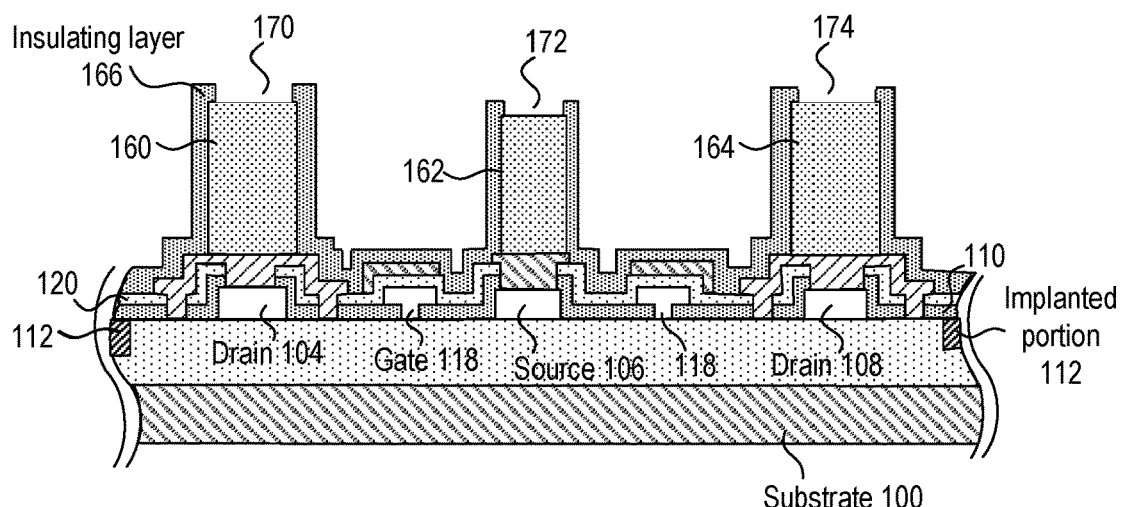

FIGS. 12 and 13 show exemplary processes to deposit an electrically insulating layer 166 and etching portions of the insulating layer 166 according to embodiments of the present invention. As depicted, the insulation layer 166 is partially etched so that the metallic elements (bonding pads) 160, 162 and 164 have contact opens 170, 172 and 174, respectively, for connecting wires thereto. For instance, in embodiments, an end of a wire may be bonded (wire bonding) to the contact open 170 so that the electrical signal from/to the wire may be transmitted to/from the drain 104 via the metallic element (bonding pad) 160 and the drain field plate 140.

Figure 14:
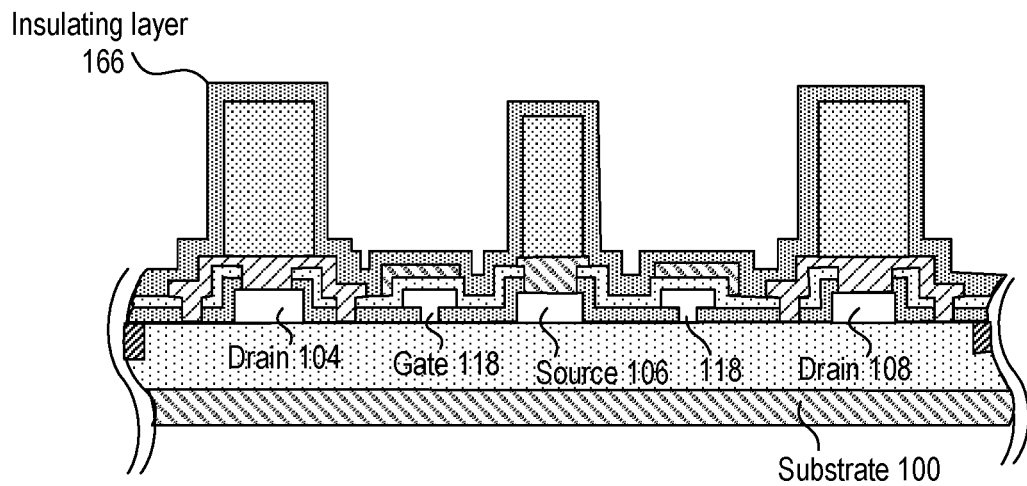
FIG. 14 shows an exemplary process for wafer thinning according to embodiments of the present invention.

FIGS. 14-24 illustrate processing the backside (bottom side) of the substrate 100 and epitaxial layer 102. FIG. 14 shows an exemplary process for wafer thinning according to embodiments of the present invention. As depicted, the substrate 100 may be thinned by suitable processes, such as lapping and polishing, so as to facilitate the assembly of the HEMT to a package and backside processes, such as via hole generation and singulation.

Figure 15:
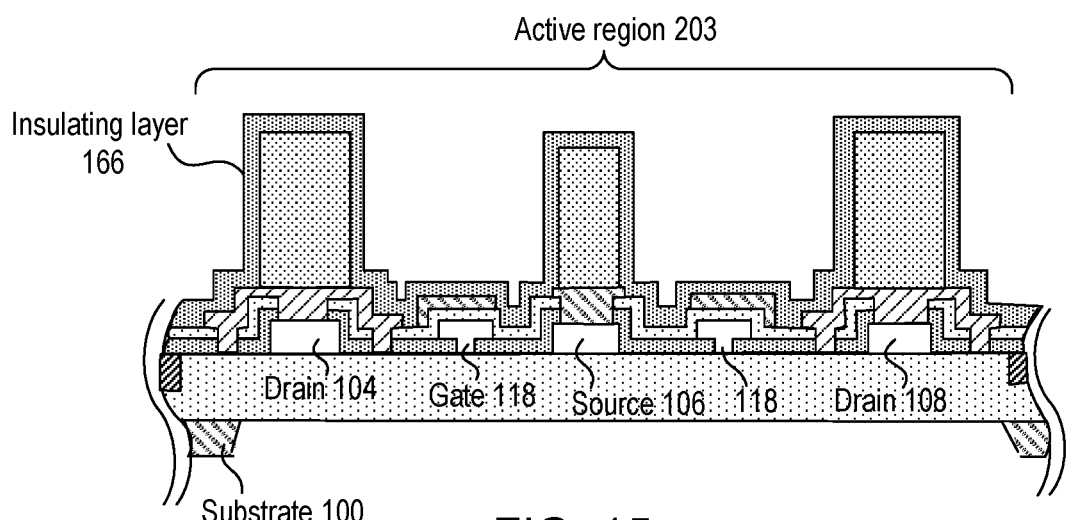
FIG. 15 shows an exemplary process for etching the substrate according to embodiments of the present invention.
Figure 16:
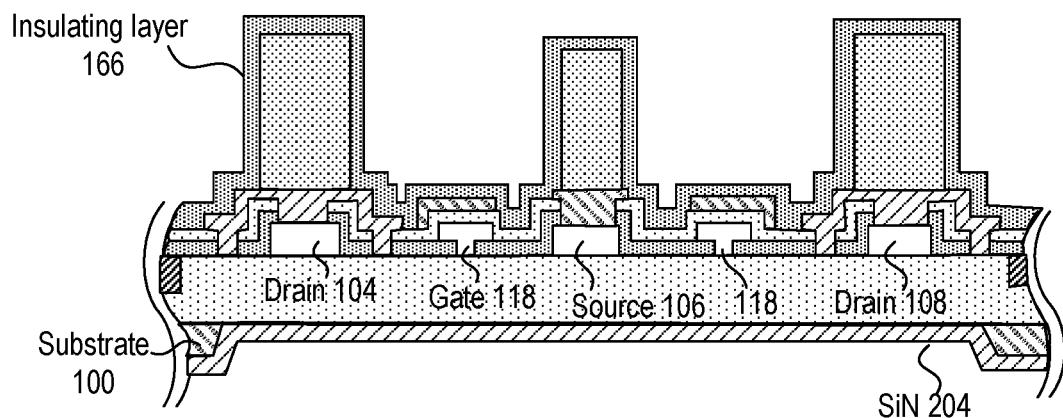
FIG. 16 shows an exemplary process for depositing a SiN layer according to embodiments of the present invention.

FIG. 15 shows an exemplary process for substrate etching according to embodiments of the present invention. As depicted, a portion of the substrate 100 under the active region 203 may be removed by a suitable process, such as dry etching or wet etching. Here, the active region 203 refers to a region below active semiconductor components, such as drain, gate and source, that generate heat energy during operation. Then, as shown FIG. 16, an electrically insulation layer 204, such as SiN layer, may be deposited over the backside (or bottom) surface of the substrate.

Figure 17:
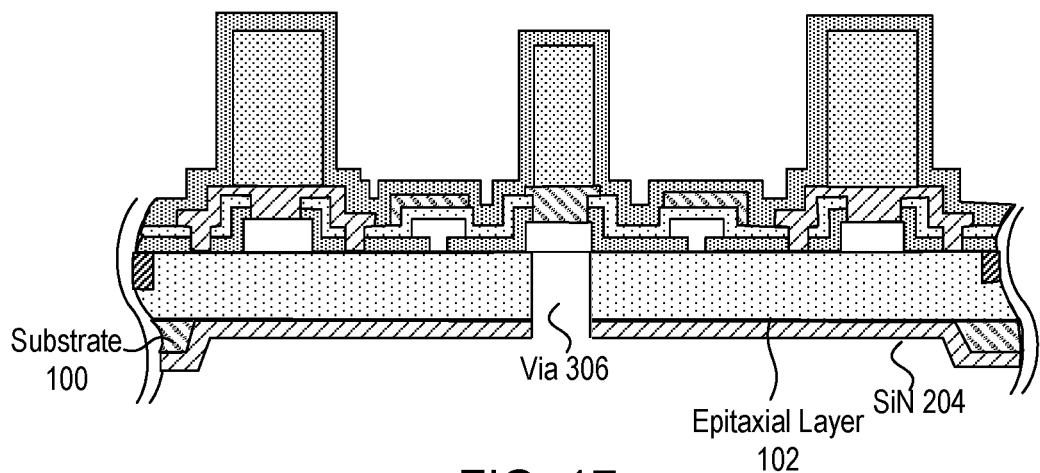
FIG. 17 shows an exemplary process for generating a via hole according to embodiments of the present invention.

FIG. 17 shows an exemplary process for generating a via hole 306 according to embodiments of the present invention. As depicted, in embodiments, the via hole 306 may extend to the bottom side of the source 106. As depicted, the insulation layer 204 and the epitaxial layer 102 may be etched by a suitable etching process to form the via hole 306, where the via hole 306 may be a slot via hole.

Figure 18:
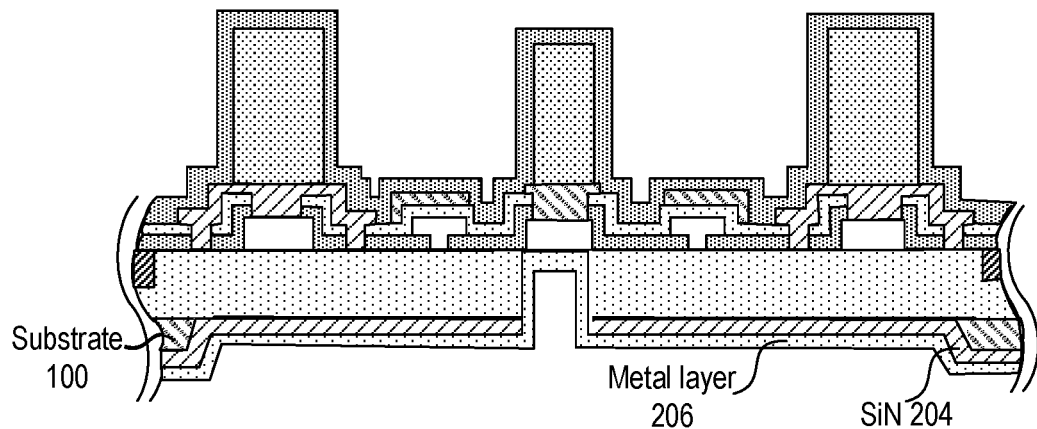
FIG. 18 shows an exemplary process for depositing a metal layer over the backside surface of the wafer according to embodiments of the present invention.

FIG. 18 shows an exemplary process for depositing a metal layer 206 over the backside surface of the substrate according to embodiments of the present invention. In embodiments, a sputtering process may be used to deposit the metal layer, formed of Ti/Au, for instance, over the backside surface of the substrate, even though other suitable process may be used to deposit the metal layer 206.

Figure 19:
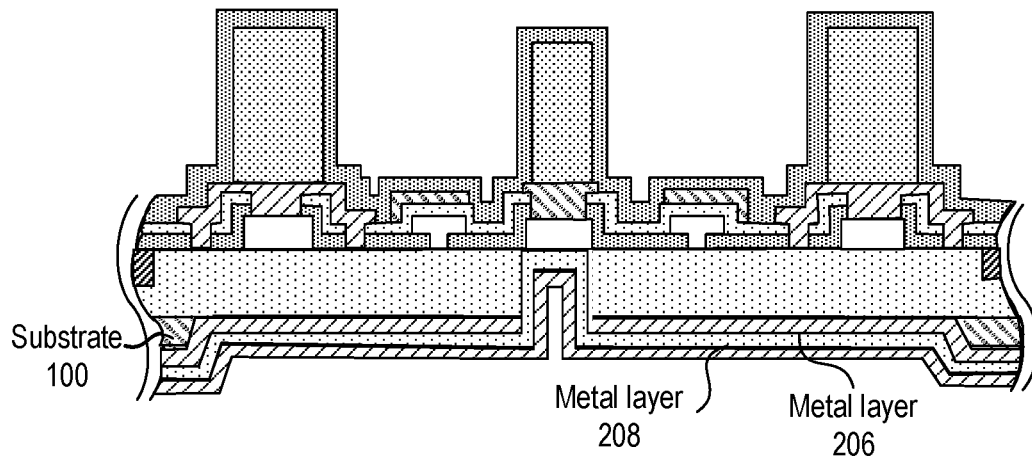
FIG. 19 shows an exemplary process for depositing a metal layer over the backside surface of the wafer according to embodiments of the present invention.

FIG. 19 shows an exemplary process for electro-plating a metal layer 208 over the backside surface of the substrate according to embodiments of the present invention. In embodiments, the metal layer 206 may be a seed layer for the metal layer 208. In embodiments, the metal layer 208 may be deposited by a suitable process, such as electrical plating process, and the metal layer 208 may have a composite metal structure, such as Cu/Au/Cu/Au and Cu/Ag/Au.

Figure 20:
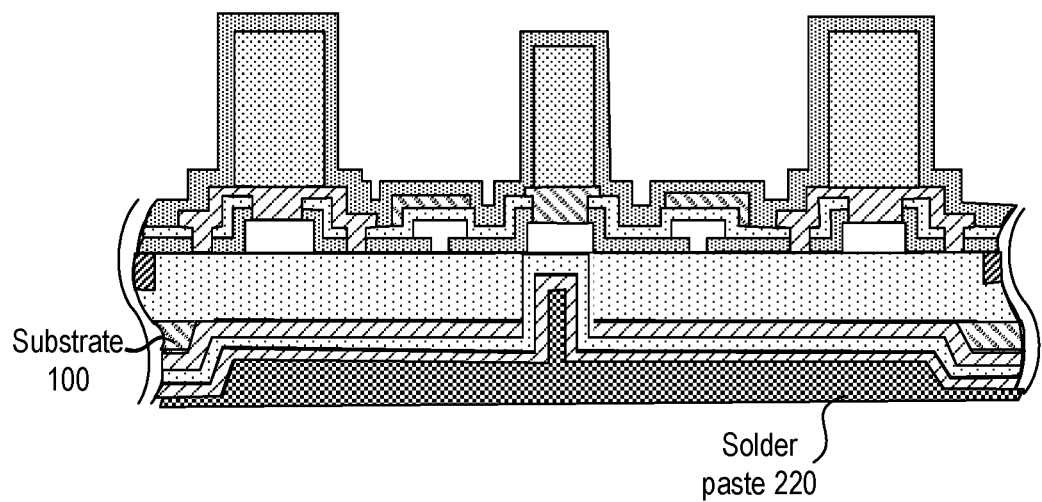
FIG. 20 shows an exemplary process for applying solder paste to the backside surface of the wafer according to embodiments of the present invention.

FIG. 20 shows an exemplary process for applying solder paste 208 to the backside surface of the substrate according to embodiments of the present invention. As depicted, the solder paste 208 may fill in the via hole 306 as well as the recessed portion of the substrate 100 under the active area 203.

As discussed above, the portion of the substrate under the active region 203 may be removed before the metal layers 206 and 208 are deposited. Since the substrate material, such as Si or sapphire, may have lower heat conductivity than the metal layers 206 and 208, the processes in FIGS. 15-20 may increase the heat conductivity of the HEMT, reducing the Tj of the transistor components in the active region 203. Likewise, since the typical substrate materials have lower electrical insulation than SiN, the backside processing increases the electrical insulation, reducing the bulk leakage current of the transistor components.

FIG. 21 shows an exemplary processing of the backside of a HEMT wafer according to embodiments of the present invention. The HEMT in FIG. 21 is similar to the HEMT in FIG. 17, with the difference that the HEMT in FIG. 21 has multiple sources 310, 314 and 318 that may be connected to each other by an air bridge (not shown in FIG. 21). For instance, in embodiments, the vias 302 and 304 may be used to electrically connect the sources 310 and 318 to the bottom side of the HEMT, where the vias 302 and 304 may be located outside the active region 309. As depicted, the insulation layer (such as SiN layer) 301, substrate 300, epitaxial layer 305 and the ion implanted region 307 may be etched by a suitable etching process to form the via holes 302 and 304.

It is noted that only three sources are shown in FIG. 21. However, it should be apparent to those of ordinary skill in the art that other suitable number of sources may be connected to each other by air bridges. Also, only two normal via holes are shown in FIG. 21, even though other suitable number of via holes may be formed.

FIG. 22 shows an exemplary process for depositing a metal layer 330 over the backside surface of the substrate according to embodiments of the present invention. In embodiments, a sputtering process may be used to deposit the metal layer, formed of Ti/Au, for instance, over the backside surface of the substrate.

Figure 23:
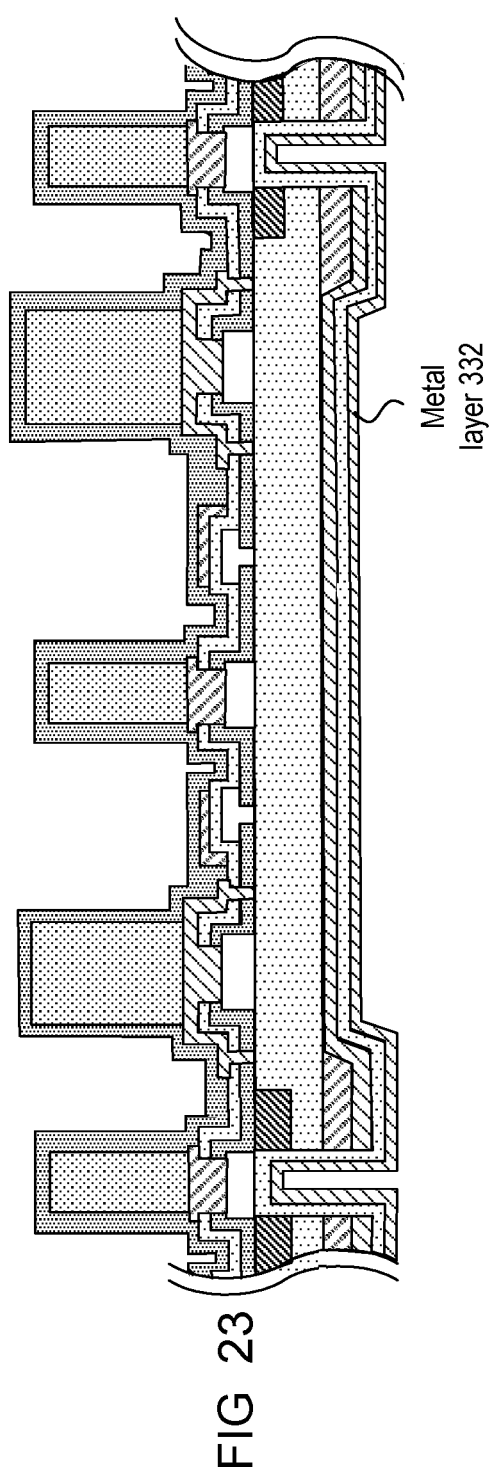
FIG. 23 shows an exemplary process for depositing a metal layer over the backside surface of the wafer according to embodiments of the present invention.

FIG. 23 shows an exemplary process for depositing a metal layer 332 over the backside surface of the substrate according to embodiments of the present invention. In embodiments, the metal layer 330 may be a seed layer of the metal layer 332. In embodiments, the metal layer 332 may be deposited by a suitable process, such as electrical plating process, and the metal layer 332 may have a composite metal structure, such as Cu/Au/Cu/Au and Cu/Ag/Au.

Figure 24:
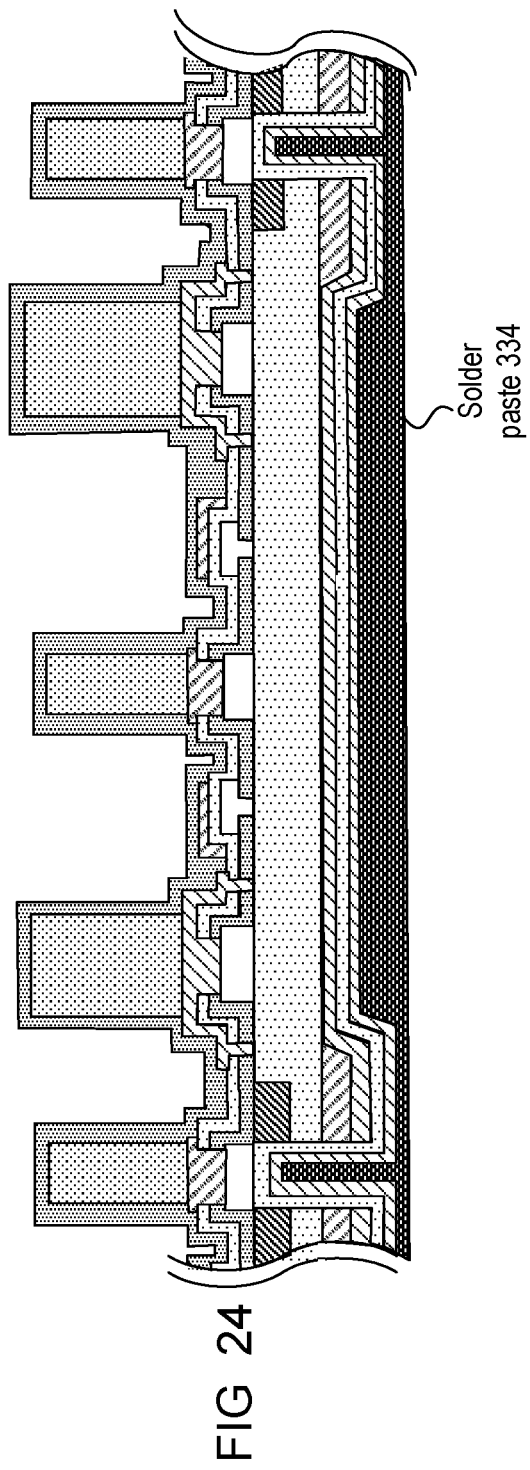
FIG. 24 shows an exemplary process for applying solder paste to the backside surface of the wafer according to embodiments of the present invention.

FIG. 24 shows an exemplary process for applying solder paste 334 to the backside surface of the wafer according to embodiments of the present invention. As depicted, the solder paste 334 may fill in the via holes 302 and 304 as well as the recessed portion of the substrate 300 under the active area 309.

The embodiments of the present disclosure include processes to remove (etch) a portion of the substrate 100 or 300 under the active area 203 or 309 and to deposit a metal layer(s). Since a metal layer has the better heat conductivity than the typical substrate material, these processes may increase heat dissipation generated by the HEMT components during operation.

The embodiments of the present disclosure include processes to remove (etch) a portion of the substrate under the active area, to deposit a metal layer, and to apply solder paste 220 or 334 to the backside surface, obviating formation of air void to thereby enhance the heat conduction characteristics of the components of the HEMT and reduce the junction temperature of the components of the HEMT.

The embodiments of the present disclosure include a process to remove (etch) a portion of the substrate under the active area and deposit a SiN layer 204 or 301. Since SiN layer has the better electrical insulation property than the typical substrate material, this process may decrease the bulk leakage current of the components of the HEMT.

In embodiments, each HEMT in FIG. 20 and FIG. 24 may be diced (singulated) from the wafer and attached to a package (not shown in FIGS. 20 and 24) by heating (i.e. reflowing) the solder paste 220 or 332. In contrast, in the conventional approaches, a solder paste including eutectic metal is applied over ceramic package or lead frame before the die is attached. Thus, in embodiments, the conventional pre-forming of eutectic material is not required, reducing at least one fabrication step and thus the manufacturing cost. In embodiments, surface-mount-device (SMD) reflow method may be used to attach the HEMT die to the package.

One or more of the processes describe in conjunction with FIGS. 1-24 may be performed by computer software. It shall be noted that embodiments of the present disclosure may further relate to computer products with a non-transitory, tangible computer-readable medium that have computer code thereon for performing various computer-implemented operations. The media and computer code may be those specially designed and constructed for the purposes of the present disclosure, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present disclosure may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present disclosure. One skilled in the art will also recognize that a number of the elements described above may be physically and/or functionally separated into sub-modules or combined together.

It will be appreciated to those skilled in the art that the preceding examples and embodiment are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure.

What is claimed is:

1. A method for processing a semiconductor transistor, the semiconductor transistor including a substrate, an epitaxial layer, and a plurality of transistor components that are formed on the epitaxial layer, the method comprising:
  removing a portion of the substrate that is disposed below a portion of the plurality of transistor components, to thereby expose a portion of a bottom surface of the epitaxial layer;
  forming an insulating layer on the exposed portion of the bottom surface of the epitaxial layer, the insulating layer being made of an electrically insulating material;
  forming at least one via that extends from a bottom surface of the insulating layer to a bottom surface of at least one of the plurality of the transistor components;
  depositing at least one metal layer on the bottom surface of the insulating layer, on a side wall of the via and on the bottom surface of the at least one of the plurality of transistor components; and
  applying a solder paste to a bottom surface of the at least one metal layer.

2. The method of claim 1, wherein the step of depositing at least one metal layer includes:
  depositing a first metal layer on the bottom surface of the insulating layer, on the side wall of the via and on the bottom surface of the at least one of the plurality of transistor components; and
  depositing a second metal layer on a bottom surface of the first metal layer.

3. The method of claim 1, wherein the semiconductor transistor is a high electron mobility transistor (HEMT).

4. The method of claim 1, wherein the at least one of the plurality of transistor components includes a source.

5. The method of claim 1, wherein the at least one metal layer has a higher thermal conductivity than the substrate.

6. The method of claim 1, wherein the at least one of the plurality of transistor components includes two or more sources and wherein the at least one via includes two or more vias and each of the two or more vias extends to the bottom surface of a corresponding one of the two or more sources.

7. A method for processing a semiconductor transistor, the semiconductor transistor including a substrate, an epitaxial layer, and a plurality of transistor components that are formed on the epitaxial layer, the method comprising:
  removing a portion of the substrate that is disposed below a portion of the plurality of transistor components, to thereby expose a portion of a bottom surface of the epitaxial layer;
  forming an insulating layer on the exposed portion of the bottom surface of the epitaxial layer, the insulating layer being made of an electrically insulating material;
  forming at least one via that extends from a bottom surface of the insulating layer to a bottom surface of at least one of the plurality of the transistor components;
  depositing a first metal layer on the bottom surface of the insulating layer, on a side wall of the via and on the bottom surface of the least one of the plurality of transistor components; and
  depositing a second metal layer on a bottom surface of the first metal layer.

8. The method of claim 7, further comprising:
  applying a solder paste to a bottom surface of the second metal layer.

9. The method of claim 7, wherein the semiconductor transistor is a high electron mobility transistor (HEMT).

10. The method of claim 7, wherein the at least one of the plurality of transistor components includes a source.

11. The method of claim 7, wherein the first and second metal layers have higher thermal conductivities than the substrate.

12. The method of claim 7, wherein the at least one of the plurality of transistor components includes two or more sources and wherein the at least one via includes two or more vias and each of the two or more vias extends to the bottom surface of a corresponding one of the two or more sources.

* * * * *